Nov. 29, 1966 W. C. McCLAY ETAL 3,289,104

GATED UNIJUNCTION OSCILLATOR WITH FEEDBACK CONTROL

Filed June 30, 1965 2 Sheets-Sheet 1

INVENTORS
WILLIAM C. McCLAY
JAMES A. WALKER
BY Claude Funkhouser
ATTORNEY
R. R. Anderson
AGENT

GATED UNIJUNCTION OSCILLATOR WITH FEEDBACK CONTROL

Filed June 30, 1965 2 Sheets-Sheet 2

United States Patent Office 3,289,104
Patented Nov. 29, 1966

3,289,104

GATED UNIJUNCTION OSCILLATOR WITH FEEDBACK CONTROL

William C. McClay, Ruxton, and James A. Walker, Severn, Md., assignors, by mesne assignments, to the United States of America as represented by the Secretary of the Navy Filed June 30, 1965, Ser. No. 468,652
4 Claims. (Cl. 331—111)

The present invention relates to a gated clock pulse generator and more particularly to a gated clock pulse generator consisting of a relaxation oscillator stage utilizing a unijunction transistor followed by a single stage pulse shaping network.

Prior to the invention disclosed herein, the gated clock pulse generator was a standard unijunction relaxation oscillator followed by a transistor amplifier which was driven into saturation by the positive pulse output of the unijunction. Because of the stringent tolerances placed on the output waveform (delay of first pulse following gate, pulse width, pulse amplitude and pulse repetition rate) some method of compensation for the widely varying parameters of the unijunction and transistor stage had to be found if consistency of operation for different transistors was to be obtained.

Since the pulse width and pulse repetition rate are interrelated, replacement of a fixed component with a variable one, which is the standard approach, was not satisfactory. Control of the first pulse following the gate depends on the D.C. voltage at the unijunction emitter during the gate. Since the firing voltage of the unijunction varies between units, some variable was needed to adjust the emitter voltage during the gate. To obtain good pulse shaping characteristics with the amplifier stage, it must utilize the high gain of the transistor and yet have a stable operating point. The transistor stage must also be in conduction, prior to the pulse from the unijunction, to prevent deterioration due to stored charge effects. Attempts to stabilize the operating point by conventional methods lowered the gain of the stage more than was tolerable.

As was pointed out above the standard or obvious methods of controlling the generator output parameters, and obtaining consistent operation between units, were not satisfactory. Although selection of matched transistors by a manufacturer is an obvious solution, it is expensive and a method used if there is no other solution. Another method would be the use of additional pulse shaping networks, however, this would result in increased cost and packaging size.

The present invention circumvents the problems of the prior art generators, resulting in a two stage generator having the unique features of simplicity of components necessary to formulate circuitry and variable symmetry controls. Also, another feature of importance is the control of the oscillator stage by utilizing an external gating signal. The combined effects of these controls allow one to adjust the repetition rate, symmetry of a single period, and overall pattern symmetry. The pulse shaping network utilizes a feature for obtaining rapid rise and fall times necessary for triggering other circuitry and therefore the basic circuit could be readily adapted to drive any type load by following the pulse shaping stage with a Darlington amplifier or emitter-follower stage. A unique feature of the present invention over prior art devices lies in the positive feedback loop from the output of the transistor amplifier to the emitter of the unijunction which effectively varies the parameters of the unijunction thereby creating improved, controllable operation in any circuit configuration. This enables the usage of a wide variety of standard unijunctions in any circuit configuration, as well as the fact that the symmetry of the output waveform may be adjusted without effecting the period is another important feature. Another unique feature of the present invention lies in the zener diode biasing of the amplifier stage which allows the designer to make use of the highest gain of the transistor stage, stabilize the operating point of the stage, and utilize nearly the full voltage swing of the stage when used as a switching circuit. These advantages may all be realized with the minimized stored charge effect normally encountered in conventional switching circuitry techniques.

An object of the present invention is to provide a gated clock pulse generator utilizing a unijunction transistor followed by a single stage pulse shaping network.

Another object of the present invention is to provide a gated pulse generator which has a positive feedback loop to the emitter of the unijunction relaxation oscillator.

Still another object of the present invention is to provide a pulse generator having a shaping network which features rapid rise and fall times necessary for triggering other circuitry.

Still another object of the present invention is to provide a pulse generator having controls for the adjustment of the repetition rate, symmetry of a single period, and overall pattern symmetry.

Still another object of the present invention is to provide a gated pulse generator which can be readily adapted to drive any type load.

Other objects and many of the attendant advantages of this invention will be readily appreciated as the same becomes better understood by reference to the following detailed description when considered in connection with the accompanying drawings wherein.

Figure 1:
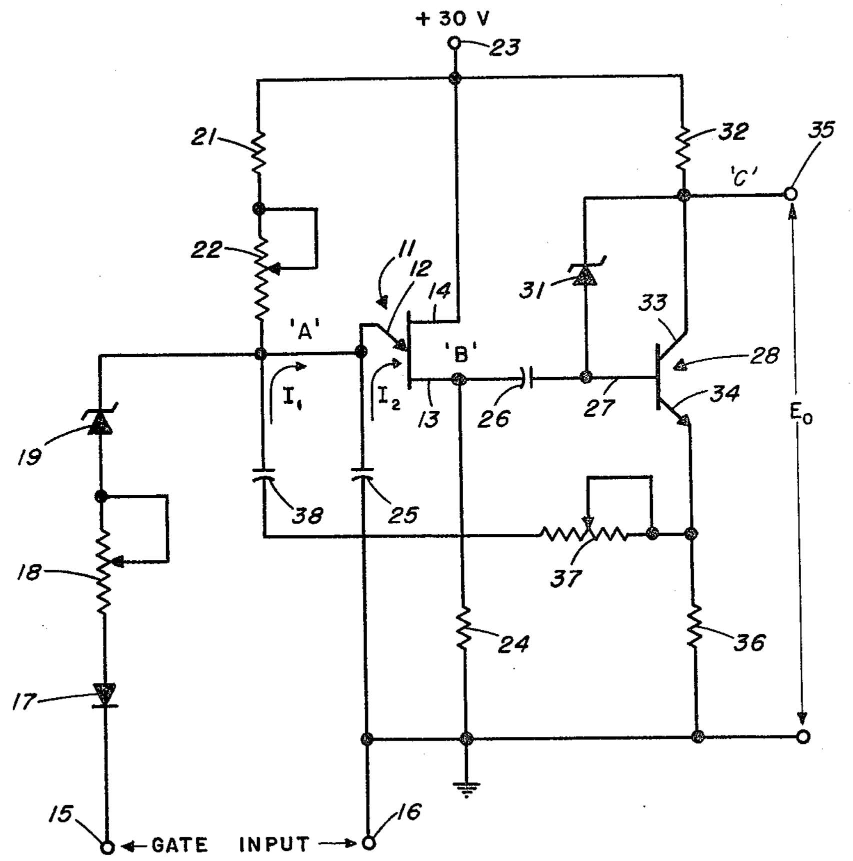
FIG. 1 shows a schematic of the pulse generator.

Referring now to the drawings wherein like reference characters designate like or corresponding parts throughout the several views, there is shown in FIG. 1 a unijunction transistor 11 having an emitter 12 and base terminals 13 and 14. A pair of input terminals 15 and 16 are provided for applying a gating signal to the unijunction 11 as will be shown hereinafter. Connected between input terminal 15 and junction point A, which connects with emitter 12 of unijunction 11, is a series network comprising a diode 17, an adjustable resistance 18 and a zener diode 19. Connected between a terminal 23 of B+ potential and junction point A is a fixed resistor 21 and an adjustable resistor 22. Also from terminal 23 is a lead which applies B+ potential to base terminal 14 of the unijunction 11. Connected between base terminal 13 and emitter terminal 12 so as to form a closed current path is a fixed resistor 24 and a capacitor 25, the operation of which will be more fully described hereinafter.

The output of unijunction 11 is fed over base terminal 13 through a capacitor 26 to the base 27 of a transistor 28. Transistor 28 may be of the PNP variety such as a 2N338, or the like. Connected between the base 27 of transistor 28 and its collector electrode 33, there is a zener diode 31 while the B+ potential is applied to the collector 33 through resistor 32. The output of transistor 28 is fed over emitter terminal 34 to an output terminal 35 while a fixed resistor 36 is connected between ground and output terminal 35. Forming a positive feedback path between the output of transistor 28 and emitter terminal 12 of unijunction 11 is an adjustable resistor 37 and a capacitor 38.

Figure 2:
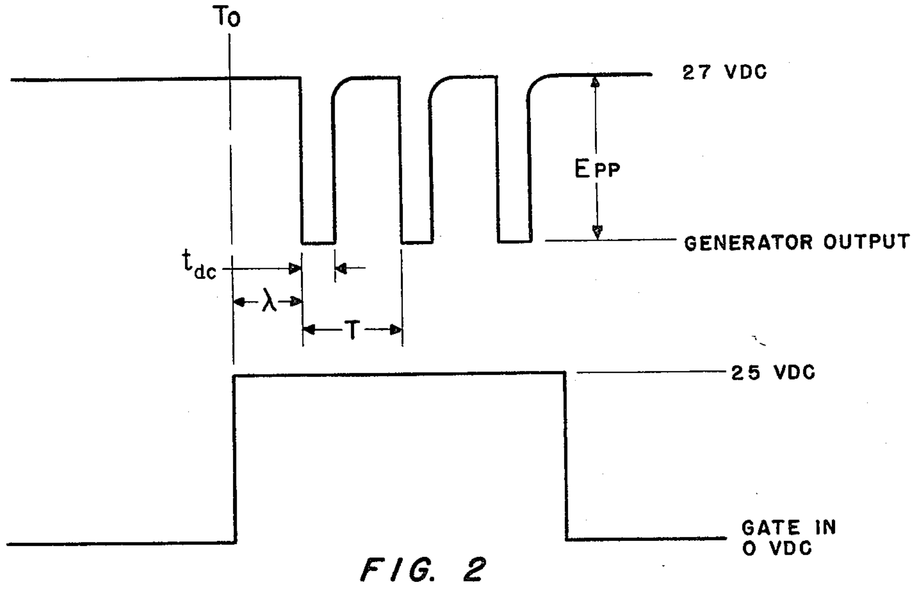
FIG. 2 shows the waveforms of the gate and output pulses.

Referring briefly to FIG. 2, there will be observed that the output of the pulse generator consists of a series of square waves, the first of which starts at a predetermined time after application of the gate pulse.

Turning now to the operation of the invention, it will be noted that when the gate signal is at ground potential or zero volt, junction point A of FIG. 1 is at some positive level determined by zener diode 19 and adjustable resistor 18. This potential level is below the firing voltage therefore inhibiting unijunction 11 from a conduction state, the variable resistor 18 being used to determine the period as shown in FIG. 2 by establishing the positive reference point of junction point A. This predetermined reference controls the time required for capacitor 25 to charge to the firing voltage thereby causing unijunction 11 to conduct. When the gate signal as applied to input terminals 15, 16 swings positive it must obtain a level higher than that impressed across capacitor 25, which will then charge to a point where unijunction 11 will conduct.

At the same time, transistor 28 is partially in a conduction state due to the biasing effect of zener diode 31 which maintains base 27 slightly positive without creating detrimental effects to the gain of transistor 28. When transistor 28 starts into the full conduction region, due to the fact that unijunction 11 is now conducting, a positive pulse is impressed at the junction of resistors 36 and 37. This pulse is then coupled back through the feedback loop consisting of resistor 37 and capacitor 38 to the emitter 12 of unijunction 11. This additional signal due to the feedback therefore causes unijunction 11 to remain turned on for a longer period of time than normal. As further clarification of this operation, consider the first instant that unijunction 11 turns on. At this time, capacitor 25 starts to discharge through the unijunction 11 and resistor 24. However, the additional current from the feedback loop tends to replenish the charge on capacitor 25 thereby the RC time constant. Unijunction 11 will discharge capacitor 25 until junction point A reaches the extinguishing voltage of unijunction 11 and then the cycle will repeat.

Figure 3:
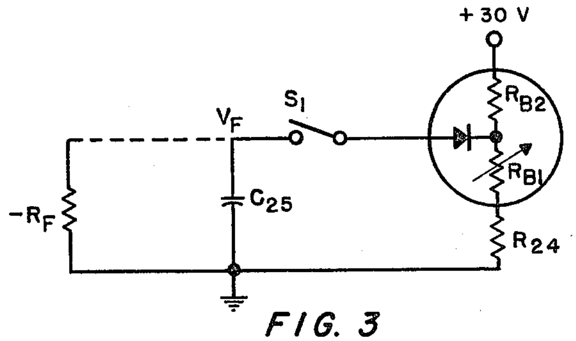
FIG. 3 shows the equivalent circuit for the unijunction.

To fully understand the principle of operation of the feedback network to the unijunction, an equivalent circuit such as that shown in FIG. 3 must be used and an analysis made during the firing time. Without feedback, the capacitor 25 charges to the firing voltage of the unijunction (represented by the closing of switch S1). It then discharges through resistor 24 and resistor B1, which is a complex function of voltage $[(R_{B1}(V)+R_{24})=R_z]$. The following equations show the discharge time involved to reach the extinguishing voltage ($V_c$) represented by the opening of switch S1:

(1) $$E(t)=(V_F)e^{-t_{dc}/R_zC}$$

(2) $$Ve=(V_F)e^{-t_{dc}/R_zC}$$

(3) $$\ln Ve-\ln V_F=e^{t_{dc}/R_zC}$$

(4) $$t_{dc}=(\ln V_F-\ln V_e)R_zC$$

Examining Equation 4 it would seem logical that changing either R or C would give the desired control of pulse width ($t_{cd}$), but changing C also changes the repetition rate (T) greatly which is undesirable. A change in R (by changing resistor 24) varies the firing voltage ($V_F$) of the unijunction which also greatly effects the repetition rate. The feedback circuit used impresses a negative resistance at the emitter of the unijunction 11 and the resulting equivalent resistance is shown in the following equations:

(5) $$-\frac{1}{R_F}+\frac{1}{R_z}=\frac{1}{Req}$$

(6) $$\frac{R_F-R_Z}{R_F\ R_z}=\frac{1}{Req}\longrightarrow Req=\frac{R_F\ R_Z}{R_Z-R_Z}$$

(7) $$t_{dc}=(\ln V_F-\ln V_e)C(Req)$$

Now varying the amount of feedback gives control over the pulse width or discharge time. When unijunction 11 stops conducting, or in other words, when switch S1 opens, $R_F$ no longer presents a negative resistance to the circuit, but rather a large resistance which has little effect on the charging time of capacitor 25 or repetition rate.

Figure 4:
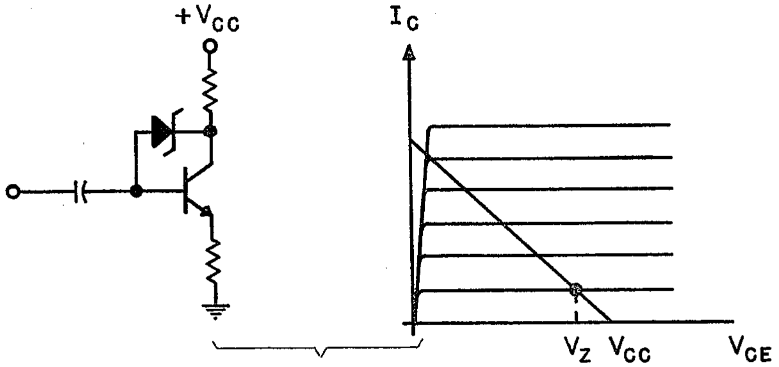
FIG. 4 shows a detailed schematic of the amplifier stage along with curves explaining its operation.

The unique feature of the amplifier stage 28 is the clamped operating point obtained by employing the zener diode 31 between collector 33 and base 27. Conventional methods of stabilizing the operating point employ degenerative biasing methods at the sacrifice of the gain of the stage. Conventional switching stages, which utilize high gain and large voltage swing, require more pulse energy because some charge is stored in the base junctions as the stage is turned on. In the present invention the zener diode 31 clamps the operating point wherever desired and utilizes the clamping current as a negative feedback to base 27 of the transistor during no signal time. By choosing a zener voltage near the point $V_{cc}$, FIG. 4, the stage will operate as a switch for low level signals. FIG. 4 shows the circuit and the operating point clamped near $V_{cc}$. Low level switching is possible because the stage 28 is always conducting, thereby reducing stored charge effects. The zener diode 31 has no effect in the circuit during signal time and therefore the gain of transistor 28 is not degenerated as in conventional circuitry. Therefore, the result is a one stage amplifier with the advantages of both switching circuits and conventional stabilized circuitry.

From the above description of the structure and operation of the present invention, it is clear that there is presented a novel and improved gated clock pulse generator. The pulse generator presented is one in which the oscillator stage is controlled by utilizing an external gating signal and controls are provided to adjust the repetition rate, symmetry of a single period, and overall pattern symmetry. Furthermore, the invention presents a pulse shaping network which utilizes a feature for obtaining rapid rise and fall times as well as one which is readily adapted to drive any type of load following the pulse shaping stage.

Obviously many modifications and variations of the present invention are possible in the light of the above teachings. It is therefore to be understood that within the scope of the appended claims the invention may be practiced otherwise than as specifically described.

What is claimed is:

1. A gated clock pulse generator comprising:
an input terminal for receiving a gating signal;
a solid state oscillator for producing a plurality of output pulses;
adjustable means connected between the input terminal and the oscillator for determining the level at which the oscillator conducts;
another solid state device for shaping the output pulses from the oscillator;
feedback means for conducting a portion of the output of the other solid state device to the input of the oscillator; and
diode means connected across the base and collector of the other solid state device for clamping the operating point of the solid state device at a desired level.

2. The gated clock pulse generator of claim 1 further including capacitive means connected to the base of the solid state oscillator for determining its period of conduction.

3. A gated pulse generator comprising:
an input terminal for receiving a gating signal;
a unijunction transistor operating as a relaxation oscillator;
an adjustable resistor-diode-zener diode network connected between the input terminal and the emitter of the unijunction transistor, the network determining the firing point of the unijunction transistor;
a capacitive means connected between the emitter and base #1 of the unijunction for determining the length of time unijunction conducts;
an NPN transistor having its base connected to base #1 of the unijunction and its emitter connected to an output terminal;
a zener diode connected between the base and the collector of the transistor to clamp the operating point of the transistor at a desired level; and
feedback means connecting the output of the transistor with the emitter of the unijunction, said feedback acting to prolong the conduction of the unijunction.

4. A gated pulse generator comprising:
a unijunction transistor oscillator having an emitter and two base electrodes;
means to apply a gating pulse to the emitter electrode of the unijunction so as to establish a level of operation;

capacitor means between the emitter and base #1 of the unijunction to regulate the width of the oscillator output pulses;
a source of potential applied to base #2 of the unijunction;
a transistor amplifier having its base connected to base #1 of the unijunction;
clamping means connected between the collector and the base of the transistor for determining its level of operation; and
feedback means connected from the emitter of the transistor amplifier to the emitter of the unijunction to aid the capacitive means in regulating the width of the output pulses.

References Cited by the Examiner

UNITED STATES PATENTS

| | | | |
|---|---|---|---|
| 3,074,028 | 1/1963 | Mammano | 331—111 |
| 3,085,165 | 4/1963 | Schaffert et al. | 307—88.5 |
| 3,139,539 | 6/1964 | Hewett | 307—88.5 |
| 3,156,875 | 11/1964 | Florino et al. | 331—111 |
| 3,214,708 | 10/1965 | Chamberlain | 331—111 |

NATHAN KAUFMAN, *Primary Examiner.*

J. KOMINSKI, *Assistant Examiner.*